United States Patent [19]

Pawlowski et al.

[11] Patent Number: 4,840,868
[45] Date of Patent: Jun. 20, 1989

[54] PHOTOSENSITIVE COMPOSITION BASED ON A DIAZONIUM SALT POLYCONDENSATION PRODUCT WITH AN ESTER POLYMER BINDER HAVING URETHANE GROUP

[75] Inventors: Georg Pawlowski; Guenter Hultzsch, both of Wiesbaden; Gerhard Mack, Walluf, all of Fed. Rep. of Germany

[73] Assignee: Hoechst Aktiengesellschaft, Frankfurt am Main, Fed. Rep. of Germany

[21] Appl. No.: 135,448

[22] Filed: Dec. 21, 1987

[30] Foreign Application Priority Data

Dec. 23, 1986 [DE] Fed. Rep. of Germany ....... 3644163

[51] Int. Cl.$^4$ ............................ G03C 1/60; G03C 1/94
[52] U.S. Cl. .................... 430/155; 430/175; 430/176; 430/906; 522/32
[58] Field of Search ............... 430/175, 176, 906, 155; 522/32

[56] References Cited

U.S. PATENT DOCUMENTS

| | | | |
|---|---|---|---|
| 3,660,097 | 5/1972 | Mainthia | 430/175 |
| 4,157,918 | 6/1979 | Wanat et al. | 430/175 |
| 4,186,017 | 1/1980 | Palmer | 430/175 |
| 4,337,307 | 6/1982 | Neubauer | 430/175 |
| 4,387,151 | 6/1983 | Bosse et al. | 430/175 |
| 4,608,331 | 8/1986 | Bernstein et al. | 430/175 |
| 4,631,245 | 12/1986 | Pawlowski | 430/175 |

FOREIGN PATENT DOCUMENTS

| | | | |
|---|---|---|---|
| 1024803 | 1/1978 | Canada | 430/175 |
| 2185120 | 7/1987 | United Kingdom | 522/32 |

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A photosensitive composition is described, which contains a diazonium salt polycondensation product and a polymeric binder which is soluble or at least swellable in aqueous-alkaline solutions and comprises a reaction product of a trimellitic anhydride, the free carboxyl group of which is esterified with an alcohol containing a urethane group, with a polymer containing hydroxyl groups and having no further functional groups capable of reaction with acid anhydrides. The composition yields an increased print run and has, at the same time, good storability and developability.

13 Claims, No Drawings

PHOTOSENSITIVE COMPOSITION BASED ON A DIAZONIUM SALT POLYCONDENSATION PRODUCT WITH AN ESTER POLYMER BINDER HAVING URETHANE GROUP

BACKGROUND OF THE INVENTION

The present invention relates to a photosensitive composition which contains a diazonium salt polycondensation product and a polymeric binder and which is especially suitable for the production of printing plates.

German Offenlegungsschrift No. 30 36 077 (equivalent to U.S. Pat. No. 4,387,151) disclosed photosensitive compositions comprising co-condensation products of condensable diazonium salts and other non-photosensitive condensable compounds combined with polymeric binders containing alkenylsulfonylurethane side groups, which are used for the production of printing plates. These compositions can be developed with purely aqueous, alkaline solutions. However, when these compositions are processed into lithographic printing plates, they yield light-hardened layers having an insufficient ink receptivity.

In German Offenlegungsschrift No. 24 29 251 similar photosensitive compositions are described, the binders of which comprise organic synthetic resins with free hydroxyl or carboxyl groups, which have been reacted with polyvalent isocyanates, epoxides or acid anhydrides as crosslinking agents. Some of these compositions still contain unreacted crosslinking groups and others contain insoluble constituents, such that their storage stability and developability are limited.

European Patent Application No. 152 819 discloses photosensitive compositions comprising diazonium salt polycondensation products and binders containing carboxyl groups, which have been obtained by reacting polymers containing hydroxyl groups with acid anhydrides. These compositions can be developed with aqueous-alkaline solutions and are suitable for use in the production of lithographic printing plates yielding large print runs. As it is desired to further increase the print runs obtained from printing plates produced with these compositions, European Patent Application No. 152 819 recommends addition of relatively small amounts of other polymers, e.g., polyurethanes, to the compositions to improve their resistance to abrasion. However, this combination leads to disadvantages in view of copying technique, for example, to an undesirable rise of tonal value. In addition, developability and storage stability are impaired.

U.S. Pat. No. 3,660,097 and German Offenlegunsschrift No. 27 39 774 also disclose compositions of the above-indicated type, in which polyurethane resins are used as the polymeric binders. These compositions have the disadvantage that the binder are insufficiently soluble in the customarily employed coating solvents and the solutions must be repeatedly filtered to remove insoluble residues. The developability of these compositions in aqueous-alkaline solutions is extremely limited and the print runs obtainable are inadequate for high-performance printing.

European Patent Application No. 0 030 001 describes a similar composition which contains a branched polyurethane as the binder. Although relatively large print runs can be obtained with the aid of this composition, it also has some disadvantages. Acidic aqueous developer solutions should, for example, preferably be used for scrum-free, speedy development of the light-hardened layer and, in the case of automatic processing, these developer solutions may give rise to corrosion problems affecting the light metal parts of processors.

SUMMARY OF THE INVENTION

It is an object of the present invention to provide a negative-working photosensitive composition which is suitable for use in the production of printing plates, particularly lithographic printing plates, which has all the advantages of the best compositions based on diazonium salt polycondesation products, which are known in the art.

It is a further object of the invention to provide a negative-working photosensitive composition which can be developed by means of practically solvent-free neutral or alkaline aqueous solutions.

It is yet another object of the invention to provide a negative-working photosensitive composition which yields printing plates producing relatively large print runs, without impairing developability and storage stability.

According to the invention a photosensitive composition is provided which contains a diazonium salt polycondensation product and a non-photosensitive polymeric binder with carboxyl side groups which is soluble or at least swellable in aqueous-alkaline solutions and comprises a reaction product of an intramolecular anhydride of an organic polycarboxylic acid with a polymer containing hydroxyl groups and having no further functional groups capable of reaction with acid anhydrides.

DESCRIPTION OF THE PREFERRED EMBODIMENTS

The composition of the invention is characterized in that the acid anhydride is a compound of the general formula I

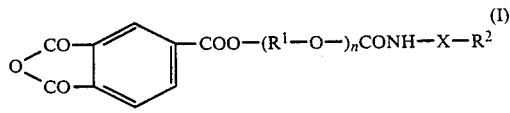

where
R$^1$ is an alkylene group having from 2 to 6 carbon atoms,
R$^2$ is a hydrogen atom, a substituted or unsubstituted alkyl, cycloalkyl, aryl or heteroyl group,
X is a single bond or one of the groups CH$_2$, SO$_2$ and O=P—R$^3$,
R$^3$ is an alkyl, alkenyl or aryl group, and
n is a number from 1 to 6

Suitable substituents in the above-indicated radicals comprise, in particular, alkyl, alkoxy, alkoxyalkyl, cycloalkyl, aryl, aryloxy, acyl, acyloxy, alkoxycarbonyl and carboxyl groups.

Particularly preferred compounds of the general formula I are those, in which X denotes a single bond or the group SO$_2$ and n is a number from 1 to 3.

The compounds of the general formula I comprise novel compounds. They are, however, prepared analogously to known compounds (cf. R.G. Barker et al., J. Chem. Soc. 1964, 3475). Preparation may comprise, for example, reacting 4-chloroformylphthalic anhydride of the formula II with urethane alcohols of the general formula III

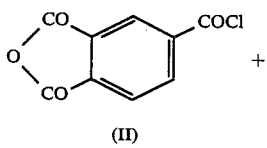

(II)

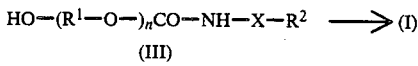

(III)

in an inert, water-free solvent with the addition of a base.

The urethane alcohols of the general formula III can preferably be obtained according to two methods.

Method a: A diol of the general formula IV

is reacted with an isocyanate of the general formula V

in such a way that only one hydroxyl group of the diol of formula IV enters into reaction. Details of this reaction are given in the examples of preparation which follow.

Method b: An amine of the general formula VI

in which X stands for a methylene group, is reacted with an ethylene carbonate derivative of the general formula VII

in which $R^4$ denotes a hydrogen atom or an alkyl group, and is thereafter optionally reacted with an oxirane of the general formula VIII

in which $R^5$ denotes a hydrogen atom or an alkyl group, to obtain a chain elongation. A chain elongation according to this method is, however, not preferred.

Diols of the general formula IV which may be used include, for example, ethanediol, 1,2-propanediol, 1,3-propanediol, 2,2-dimethylpropane-1,3-diol, 1,4-butanediol, 1,6-hexanediol, 3-oxa-pentane-1,5-diol, 3,6-dioxa-octane-1,8-diol or similar diols.

Isocyanates of the general formula V include, for example, methyl, ethyl, propyl, isopropyl, butyl, hexyl, cyclohexyl or octadecylisocyanate as well as phenyl, tolyl, chlorophenyl, fluorophenyl or napthylisocyanate. In addition, unsaturated isocyanates, such as allylisocyanate, or substituted isocyanates, such as isocyanatoalkanoic acid alkylester, can also be used.

Most of the isocyanates enumerated above are commercially available or can be prepared according to known methods.

Sulfonylisocyanates, for example, methylsulfonyl, ethylsulfonyl, chloropropylsulfonyl, propylsulfonyl, phenylsulfonyl, tolylsufonyl, phenoxysulfonyl, vinylsulfonyl or propenylsulfonylisocyanates can also advantageously be used. Other suitable isocyanates of the general formula V include phosphinic acid isocyanates, for example, dimethyl phosphinic acid, ethylmethyl phosphinic acid, chloromethyl-methyl phosphinic acid, methylphenyl phosphinic acid, methylvinyl phosphinic acid or phenylvinyl phosphinic acid isocyanate.

The reaction of the diols with the isocyanates to form urethane alcohols of the general formula III is effected in a manner known per se, for example, in a water-free, chemically non-reactive solvent for example, tetrahydrofuran, in the presence of a basic or organometallic catalyst.

Amines of the formula VI which are preferably used include primary aliphatic amines, for example, methyl, ethyl, propyl, isopropyl, n-butyl, n-hexyl, cyclohexyl, octyl, decyl, dodecyl, 2-methoxyethyl, 2-ethoxyethyl or 2-(2-methoxy-ethoxy)-ethyl amine, aminoacid alkylesters, other aliphatic aminoacid esters, unsaturated amines, such as allyl amine; aralkyl amines, such as benzyl amine, methylbenzyl amine, methoxybenzyl amine, chlorobenzyl amine, fluorobenzyl amine, nitrobenzyl amine; and also aminomethyl pyridine or aminomethyl benzimidazole and the like.

Ethylenecarbonate derivatives of the general formula VII which are used include, in particular, ethylene carbonate and methylethylene carbonate. The amines of the general formula VI are reacted with the ethylene carbonates to form urethane alcohols of the general formula III, either with or without a solvent at temperatures from about 70° C. to 100° C. To obtain a chain elongation, the urethane alcohols thus obtained, after isolating, can be reacted with oxiranes of the general formula VIII, particularly with ethylene oxide or propylene oxide; however, this is not a preferred embodiment of the present invention.

In the further reaction of the urethane alcohols of formula III to produce the corresponding esters of trimellitic anhydride, the urethane alcohols, optionally in a dissolved form, are added dropwise to a solution of 4-chloroformylphthalic anhydride, for example, in a water-free toluene, tetrahydrofuran or dioxane, in the presence of an acid-binding compound, such as pyridine, at temperatures in the range between −10° C. and +25° C. The reaction solution is allowed to post-react for some time and is then separated from the precipitated salt. The compounds of the general formula I which are thus obtained can be processed in solution and can be isolated in the customary manner and then used.

In the following examples of preparation, the synthesis of the compounds corresponding to the general formula I is explained in detail.

EXAMPLE OF PREPARATION 1 (METHOD A)

200 g of ethylene glycol (3.22 mols) are mixed with 200 ml of tetrahydrofuran and after adding 0.5 g of diazabicyclo[2.2.2]octane 139 g of butylisocyanate (1.4 mols) are added dropwise with stirring. In the process the mixture warms up and, upon terminating the dropwise addition, is heated to 60° C. and allowed to react for an additional five hours. The solvent is evaporated and the liquid residue is distilled. The urethane alcohol, which is a clear, viscous liquid, is obtained at 0.027 mbar/110° C. in a yield of 200 g (=89% of theory).

135 g of the urethane alcohol (0.84 mol) are dissolved in 200 ml of toluene and added with stirring at 0° C. to a mixture comprising 177 g of 4-chloroformylphthalic anhydride (0.84 mol), 66.5 g of pyridine (0.84 mol) and 600 ml of toluene. Temperature is kept constant by cooling with ice. Once the addition is terminated, the reaction mixture is allowed to warm up to room temperature and is stirred for another four hours. The pyridinium chloride which has been deposited is filtered off by suction, washed with toluene and the combined solutions are concentrated in a rotary evaporator. A light, viscous oil is left which crystallizes after some time. The 2-(n-butylaminocarbonyloxy)ethyl ester of trimellitic anhydride thus obtained is recrystallized from a mixture of toluene and n-hexane.
Yield: 174 g (=62% of theory)
Melting point: 157° C.-159° C.

EXAMPLE OF PREPARATION 2 (METHOD B)

80 g of n-butyl amine (1.09 mols) are mixed with 96.3 g of ethylene carbonate (1.09 mols) and heated at 70° C. for five hours, with stirring. The reaction mixture is then subjected to fractional distillation. The urethane alcohol, which is a clear, viscous liquid, is obtained at 0.027 mbar/110° C. in a yield of 149 g (=85% of theory). The further reaction of the urethane alcohol with 4-chloroformyl-phthalic anhydride is carried out as described in Example of Preparation 1.
Melting Point: 157° C.-159° C.

EXAMPLE OF PREPARATION 3 (METHOD B)

115 g of n-hexyl amine (1.14 mols) are mixed with 100 g of ethylene carbonate (1.14 mols) and heated at 70° C. for five hours, with stirring. A fractional distillation is then carried out. The urethane alcohol, which is a clear liquid, is obtained in a yield of 170.4 g (=79% of theory) at 126° C.-130° C./0.027 mbar.

162 g of the urethane alcohol (0.86 mol) are dissolved in 200 ml of toluene and added with stirring at 0° C. to a mixture comprising 181 g of 4-chloroformylphthalic anhydride (0.86 mol), 68 g of pyridine (0.86 mol) and 600 ml of toluene. Temperature is kept constant by cooling with ice. After the addition the reaction mixture is allowed to warm up to room temperature and is stirred for another four hours. The pyridinium chloride which has been deposited is filtered off by suction, washed with toluene and the combined solutions are concentrated in a rotary evaporator.

An oil is left which crystallizes after some time. The 2-(n-hexylaminocarbonyloxy)ethyl ester of trimellitic anhydride thus produced is recrystallized from a mixture of toluene and n-hexane.
Yield: 176 g (=56% of theory)
Melting point: 99° C.-101° C.

EXAMPLE OF PREPARATION 4 (METHOD B)

60 g of allyl amine (1.05 mols) are mixed with 92.5 g of ethylene carbonate (1.05 mols) and 1.5 g of p-methoxy phenol and heated at 50° C. for five hours with stirring. Then a fractional distillation is carried out. The urethane alcohol, which is a clear liquid, is obtained at 103° C.-106° C./0.027 mbar in a yield of 110 g (=72% of theory).

108 g of the urethane alcohol (0.74 mol) are dissolved in 200 ml of toluene and a mixture comprising 155.8 g of 4-chloroformyl-phthalic anhydride (0.74 mol), 58.5 g of pyridine (0.74 mol) and 300 ml of toluene is metered in with stirring at 0° C. Temperature is kept constant by cooling with ice. After the addition the reaction mixture is allowed to warm up to room temperature and is stirred for another four hours. The pyridinium chloride which has been deposited is filtered off by suction, washed with toluene and the combined solutions are concentrated in a rotary evaporator.

An oil is left which crystallizes after some time. The 2-(allylaminocarbonyloxy)ethyl ester of trimellitic anhydride thus obtained is recrystallized from toluene.
Yield: 159 g (=67% of theory)
Melting point: 99° C.-102° C.

EXAMPLE OF PREPARATION 5 (METHOD B)

109 g of benzyl amine (0.98 mol) are mixed with 86.3 g of ethylene carbonate (0.98 mol) and heated at 70° C. for five hours with stirring. The reaction solution is then cooled to room temperature and, in the process, crystallization of the product sets in after some time. Upon recrystallization of this crude product from a mixture of n-hexane and toluene a colorless solid product is obtained in a yield of 104.7 g (=54% of theory). Melting point: 102° C.-103° C.

96 g of the urethane alcohol (0.49 mol) are dissolved in 100 ml of toluene and 200 ml of tetrahydrofuran and metered into a mixture comprising 103.2 g of 4-chloroformyl-phthalic anhydride (0.49 mol), 38.8 g of pyridine (0.49 mol) and 200 ml of toluene at 0° C. Temperature is kept constant by cooling with ice. After the addition the reaction mixture is allowed to warm up to room temperature and is stirred for another four hours. The pyridinium chloride which has been deposited is filtered off by suction, washed with toluene and the combined solutions are concentrated in a rotary evaporator.

A solid substance is left. The 2-(benzylamino-carbonyloxy)ethyl ester of trimmellitic anhydride thus obtained is recrystallized from a mixture of toluene and n-hexane.
Yield: 101 g (=56% of theory)
Melting point: 104° C.-106° C.

EXAMPLE OF PREPARATION 6 (METHOD B)

27 g of 3-aminomethyl-pyridine (0.25 mol) and 22 g of ethylene carbonate are heated at 70° C. for five hours with stirring. The reaction is checked for completion by means of thin-layer chromatography. The crude product is filtered over silica gel using ethanol as an eluent. After the solvent has been evaporated 44 g (=89% of theory) of a weakly brownish solid substance are left.
Melting point: 55° C.-57° C.

42 g (0.21 mol) of the urethane alcohol are dissolved in 200 ml of tetrahydrofuran and added with stirring at 0° C. to a mixture comprising 44.2 g of 4-chloroformylphthalic anhydride (0.21 mol), 20 g of pyridine and 100 ml of tetrahydrofuran. Temperature is kept constant by cooling with ice. After the addition, the reaction mixture is allowed to warm up to room temperature and is stirred for another four hours. It is further processed as described in the preceding examples.

Upon recrystallization from a mixture of toluene and butanone, white crystals of 2-(pyrid-3-yl-methylaminocarbonyloxy)ethyl ester of trimellitic anhydride are obtained.
Yield: 62 g (=79% of theory)
Melting point: 142° C.-144° C.

EXAMPLE OF PREPARATION 7 (METHOD A)

200 g of ethylene glycol (3.22 mols) are mixed with 200 ml of tetrahydrofuran and 197 g of tolylsulfonyl isocyanate (1 mol) are added dropwise with stirring. The mixture warms up and is stirred for another five hours. Tetrahydrofuran and ethylene glycol are distilled off in vacuo. The solidifying residue is recrystallized from ethanol.

Yield: 231 g (=89% of theory) of a white powder
Melting point: 187° C.-191° C.

As described in the preceding examples, 100 g of the sulfonylurethane alcohol (0.4 mol), 81.2 g of 4-chloroformyl-phthalic anhydride (0.4 mol) and 32 g of pyridine are allowed to react with one another in 800 ml of tetrahydrofuran. The crude product is purified by recrystallization from a mixture of toluene and acetone. White crystals of the 2-(p-tolylsulfonylamino-carbonyloxy)ethyl ester of trimellitic anhydride are obtained.

Yield: 148 g (=85% of theory)
Melting point: 130° C.-131° C.

The other compounds of the general formula I can also be prepared according to these working instructions.

Polymers containing hydroxyl groups which can be used include, in particular, polymers having vinyl alcohol units, but also epoxy resins and saponified epoxy resins, polyamides, polyurethanes or polyesters having free OH groups, copolymers of allyl alcohol or higher molecular weight unsaturated alcohols, polyhydroxyalkyl acrylates and polyhydroxyalkyl methacrylates or the copolymers thereof, natural polymers containing hydroxyl groups, such as cellulose esters and cellulose ethers, and similar polymers having free OH groups.

Suitable polymers containing vinyl alcohol units include partially saponified polyvinyl esters, polyvinyl acetals having free hydroxyl groups, in particular polyvinyl formals and polyvinyl butyrals, and corresponding reaction products of copolymers or of copolymers with vinyl ester units, vinyl acetal units or vinyl alcohol units. The hydroxyl number of these starting polymers should be in the range from about 30 to 700, preferably from about 100 to 500. The molecular weight distribution, i.e. the dispersity of these polymers, should be as small as possible.

The molecular weights of the binders containing carboxyl groups are generally in the range between about 5,000 and about 200,000 or higher, preferably between about 10,000 and 100,000. The acid numbers of binders can generally be in the range between about 10 and 120, preferably between about 15 and 100.

The reaction between acid anhydride and polymer containing hydroxyl groups proceeds very smoothly and is a quantitative reaction in many cases; it is therefore very readily reproducible. As a consequence, it is possible to exactly and reproducibly adjust the desired acid number of the binder, for example, for the application of a particular developer.

The reaction can be run in ketones, for example, butanone, or in ethers, for example, tetrahydrofuran or dioxane. As the catalysts, tertiary amines are appropriately employed. In general, from about 3 to 100 parts by weight of anhydride, from about 1,000 to 3,000 parts by weight of solvent and from about 0.5 to 5 parts by weight of tertiary amine are used per 100 parts by weight of polymer containing hydroxyl groups.

The negative-working diazonium salt polycondensation product comprises recurrent units A-N₂Q and B, which are linked by intermediate members, preferably methylene groups which are derived from condensible carbonyl compounds. A is the radical of an aromatic diazonium compound which is capable of condensation with formaldehyde and B is the radical of a compound which is free of diazonium groups and is capable of condensation with formaldehyde.

Suitable diazonium salt polycondensation products are condensation products of condensible aromatic diazonium salts, for example, of diphenylamine-4-diazonium salts, with aldehydes, preferably with formaldehyde. It is particularly advantageous to use co-condensation products containing, in addition to the diazonium salt units other, non-photosensitive units which are derived from condensible compounds, particularly from aromatic amines, phenols, phenol esters, aromatic thioesters, aromatic hydrocarbons, aromatic heterocyclic compounds and organic acid amides. These condensation products are described in German Offenlegungsscrhift No. 20 24 244. Generally, all diazonium salt polycondensation products described in German Offenlegungsschrift No. 27 39 744 are suitable.

The diazonium salt units A-N₂Q, wherein A is the radical of an aromatic diazonium compound, are preferably derived from compounds of the formula $(R^6-R^7-)_pR^8-N_2Q$, in which Q is the anion of the diazonium compound,
p is an integer from 1 to 3,
$R^6$ is an aromatic radical which is capable of condensation with an active carbonyl compound in at least one position,
$R^8$ is an optionally substituted phenylene group, and
1 $^7$ is a single bond or one of the groups:

—(CH₂)$_q$—NR⁹—,
—O—(CH₂)$_r$—NR⁹—,
—S—(CH₂)$_r$—NR⁹—,
—S—CH₂CO—NR⁹—,
—O—R¹⁰—O—,
—O—,
—S—, or
—CO—NR⁹—, where q is a number from 0 to 5,
r is a number from 2 to 5,
$R^9$ is a hydrogen atom, an alkyl group having from 1 to 5 carbon atoms, an aralkyl group having from 7 to 12 carbon atoms or an aryl group having from 6 to 12 carbon atoms, and
$R^{10}$ is an arylene group having from 6 to 12 carbon atoms.

The compositions according to the present invention generally comprise from about 5 to 90, preferably from about 10 to 70% by weight of diazonium compound, and from about 95 to 10, preferably from about 90 to 30% by weight of polymeric binder.

To stabilize the photosensitive composition, it is advantageous to add a compound having an acid character. Compounds which can be used include mineral acids and strong organic acids, with phosphoric acid, sulfuric acid, perchloric acid, boric acid or p-toluene sulfonic acid being preferred. Phosporic acid is a particularly suitable acid. Plasticizers, adhesion promoters, dyes, pigments and color precursors can also be added to the compositions.

The type of quantity of such additions depend upon the field of application for which the photosensitive composition is intended. In principle, care must be taken that the added substances do not absorb an excessive portion of the actinic light which is required for crosslinking, and thus reduce the practical sensitivity to light.

The photosensitive compositions can also contain dyes and/or pigments which may act as contrast enhancing agents and may also serve to reinforce the layer. Suitable dyes are, for example, specified in U.S. Pat. Nos. 3,218,167 and 3,884,693. Particularly suitable are, for example, Victoria Pure Blue FGA (Color Index Basic Blue 81), Renol Blue B2G-H C.I. 74 160), Crystal Violet, Rhodamine 6 GDN (C.I. 45 160) or Renol Carmine FBB-HW (C.I. Pigment Red 146). To enhance the image contrast after exposure, Metanil Yellow (C.I. 13 065), Methyl Orange (C.I. 13 025) or phenylazodiphenylamine can be used.

Within the scope of the present invention, the following weight proportions of the most important components of the photosensitive composition are preferred, which are based on the content of non-volatile constituents, i.e., the constituents of the solid photosensitive layer obtained after evaporation of the solvent:

Binder: 30 to 90%
Diazonium salt polycondensation product: 10 to 70%
Acid: 0 to 10%
Dye or pigment: 0 to 12%
Dye which changes its color upon exposure: 0 to 5%.

The support material is coated from appropriate organic solvents or solvent mixtures, generally by flow-coating, spraying or dipping.

Suitable solvents include alcohols, ketones, esters, ethers, and the like. The partial ethers of glycols or of ketoalcohols have proved to be favorable solvents, for example, ethylene glycol monomethyl ether or propylene glycol monomethyl ether.

Suitable supports are, for example, magnesium, zinc, copper, mechanically, chemically and/or electrochemically grained aluminum, anodically oxidized aluminum, steel, and also polyester film or cellulose acetate film, Perlon gauze, etc., the surfaces of which, optionally, may have been pretreated. The support material may be the final support or a temporary support material from which the photosensitive layer is transferred by lamination to the workpiece to be processed.

The recording material which is prepared using the photosensitive compositions serves, on the one hand, to produce images on suitable supports or receptor sheets and, on the other hand, to produce reliefs which are used as printing plates, screens, resists, and the like. In addition, it is also possible to use the photosensitive compositions for the formulation of UV-hardenable printing inks or for the preparation of lacquers which are hardenable by ultraviolet radiation and may be used for the protection of surfaces.

In a particularly preferred embodiment the composition is used for the production of lithographic printing plates, in which aluminum is the preferred support material.

It is particularly preferred to pretreat the aluminum used for this purpose in the usual manner, for example, by a mechanical, chemical and/or electrochemical graining process which is, optionally, followed by an anodic oxidation. A further treatment of this support material, for example, with polyvinyl phosphonic acid, alkali metal silicate, phosphate, hexafluorozirconate, chromate, borate, polyacrylamide and cellulose derivatives is advantageous.

The recording materials obtained from the compositions are processed in the well-known manner, by exposing imagewise and washing out the unexposed layer areas with a suitable developer.

The recording material is exposed under an original, as is known in the art, using light sources which emit light with the highest possible spectral fraction in the near ultraviolet region. Exposure can also be effected by laser irradiation. Suitable lasers for irradiation are shorter-wave lasers of appropriate performance, for example, Ar lasers, krypton ion lasers, helium/cadmium lasers, emitting in the region between about 300 and 600 nm and, for some layers, even $CO_2$ lasers, which emit at 10.6 $\mu$m, or YAG lasers emitting at 1.06 $\mu$m.

As the developers, practically neutral or alkaline aqueous solutions are used, which have a pH in the range from about 6 to 14, preferably from about 7.5 to 12, and which contain buffer salts, for example, water-soluble alkalimetal phosphates, silicates, borates, carbonates, acetates or benzoates. Additional constituents used are wetting agents, preferably anionic wetting agents and, if appropriate, water-soluble polymers. The solution can also contain minor amounts, for example, up to about 5% by weight, preferably not more than about 2% by weight, of water-miscible organic solvents. It is preferred to use solvents having low volatility, for example, araliphatic alcohols, the vapor pressure of which is of no consequence in the handling of the developer.

Development can be performed in a known manner by dipping, spraying, brushing or wiping-over with a pad.

The binders containing urethane and carboxyl groups, which are used according to the present invention, can easily and reproducibly be prepared. They are readily compatible with other constituents of the layer and are readily combined with each other and also with other polymers to form homogeneous layers.

The layers produced are hardly susceptible to scratching, are easily developed with aqueous-alkaline solutions, and yield an excellent differentiation between image and non-image areas and a steep gradation.

The extraordinarily large print run and the good ink receptivity obtained with printing forms prepared from the material of the present invention are particularly advantageous. The printing stencils are also highly resistant to alkaline developers.

Other advantages offered by the layers are the very good rendering of tonal values and the remarkably low susceptibility to halations. Moreover, the compositions and recording materials of the present invention show an excellent storability.

In the examples which follow the invention is explained in detail. Parts by weight and parts by volume are related as g/cm$^3$, percentages and quantitative proportions refer to units by weight, unless otherwise indicated.

EXAMPLE OF APPLICATION 1

40 parts by weight of a polyvinyl butyral having a molecular weight of about 70,000 to 80,000 and comprising 71% of vinyl butyral units, 2% of vinyl acetate units and 27% of viyl alcohol units, and 24 parts by weight of the acid anhydride described in Example of Preparation 1, are dissolved in 700 parts by weight of methyl ethyl ketone, while heating. 4 parts by weight of triethylamine are added to the clear solution and the solution thus obtained is refluxed for five hours. After cooling, the solution is added dropwise to 10,000 parts by weight of distilled water. In the process, a fibrous, white material is obtained, which is filtered off and dried to constant weight in vacuum at 40° C.

Yield: 60.5 parts by weight
Analysis: C 60.4%; H 8.2%, N 1.3%
Acid Number: 62
A coating solution prepared from
- 31 parts by weight of the above-described polymer,
- 10.5 parts by weight of a diazonium salt polycondensation product prepared from 1 mole of 3-methoxy-diphenylamine-4-diazonium sulfate and 1 mole of 4,4'-bis-methoxymethyldiphenylether in an 85% strength phosphoric acid and isolated as the mesitylene sulfonate,
- 2.0 parts by weight of phosphoric acid (85% strength),
- 1.5 parts by weight of Victoria Pure Blue FGA (C.I. Basic Blue 81), and
- 0.3 part by weight of phenylazodiphenylamine in
- 1,400 parts by weight of ethylene glycol monomethyl ether and
- 320 parts by weight of tetrahydrofuran, is applied to an aluminum foil which has been grained by brushing with an abrasive slurry and then anodized and pretreated with an 0.1% strength aqueous solution of polyvinyl phosphonic acid. After application the coating solution is dried.

The photosensitive layer thus obtained, which has a coating weight of 0.85 g/m² is exposed for 18 seconds under a standard negative original, using a 5 kW metal halide lamp. The exposed layer shows a clear contrast between exposed and unexposed areas and is treated with a developer solution having the following composition:
- 5.0 parts by weight of sodium octyl sulfate,
- 1.5 parts by weight of sodium metasilicate×5 water,
- 1.5 parts by weight of trisodium phosphate×12 water,
- 0.5 part by weight of disodium hydrogen phosphate×12 water,
- 91.5 parts by weight of demineralized water, which is applied with a plush pad. In the developing process the unexposed layer areas are properly removed within a short period of time; development is followed by rinsing with water and drying.

The exposed and developed plate shows a solid step 4 of a continuous-tone step wedge having a density range from 0.15 to 1.50, with density increments of 0.15. The printing plate obtained in this manner yields a print run of more than 80,000 printed sheets on a sheet-fed offset machine.

EXAMPLE OF APPLICATION 2

25.3 parts by weight of a copolymer of styrene and allyl alcohol, which comprises 46% of styrene units and 54% of allyl alcohol units and has an hydroxyl number of 420 is dissolved in 402 parts by weight of methyl ethyl ketone. 14.4 parts by weight of the anhydride described in Example of Preparation 3 are added to the clear solution. When the anhydride has also dissolved, 1.15 parts by weight of triethylamine are added and the mixture is refluxed for 5 hours and, after cooling, is added dropwise to 10,000 parts by weight of demineralized water, producing a fine-grained but readily filterable white powder which is filtered off by suction and dried as described in Example of Application 1.

Yield: almost quantitative
Analysis: 67.5% C; 8.0% H; 1.4% N
Acid Number: 54
A coating solution prepared from
- 86.5 parts by weight of the above-indicated binder,
- 29 parts by weight of the diazonium salt polycondensate described in Example of Application 1,
- 3.5 parts by weight of phosphoric acid (85% strength),
- 4.3 parts by weight of Victoria Pure Blue FGA and 1 part by weight of phenylazodiphenylamine in
- 4,000 parts by weight of ethylene glycol monomethyl ether is applied to an aluminum foil which has been electrochemically grained in nitric acid and thereafter anodically oxidized and post-treated with polyvinyl phosphonic acid. The dry layer weight is 0.95 g/m².

The plate is exposed as indicated in Example 1 and is then developed with a mixture of
- 25 parts by weight of salicylic acid and
- 75 parts by weight of water, which has been adjusted to a pH of about 8 by means of ethylene diamine. After inking, a readily ink-receptive printing plate is obtained, the non-image areas of which do not accept greasy printing inks. When the printing plate is used for printing on a sheet-fed offset machine several thousands of good prints are obtained.

EXAMPLE OF APPLICATION 3

36.4 parts by weight of a polyvinylformal having a molecular weight of about 25,000 to 30,000 and comprising 68% of vinylformal units, 25% of vinyl acetate units and 7% of vinyl alcohol units (hydroxyl number 85), and 14.6 parts by weight of the anhydride described in Example of Preparation 3 are dissolved in 637 parts by weight of dioxane to give a clear solution. To this solution, 2.5 parts by weight of diazabicyclo[2.2.2.]octane are added and the mixture is heated at 100° C. for seven hours. After cooling, the solution is added dropwise to 8,000 parts by weight of demineralized water, producing a white, relatively brittle product which is filtered off by suction and dried. The yield is 43 parts by weight of a polymer which has an acid number of 30 and contains 57.3% of C, 7.6% of H and 0.7% of N. A coating solution prepared from
- 20.0 parts by weight of the above-indicated polymer,
- 20.0 parts by weight of the diazonium salt polycondensation product described in Example of Application 1,
- 2.0 parts by weight of phosphoric acid (85% strength),
- 2.0 parts by weight of Renol Blue B2G-HW (C.I. 74 160) and
- 0.2 part by weight of phenylazodiphenylamine in
- 1,500 parts by weight of ethylene glycol monomethyl ether is applied by spin-coating to the support described in Example of Application 2. The dried layer has a layer weight of 1.0 g/m².

Exposure is effected as specified in Example of Application 1. The plate can be developed within a very short period using a developer of the following composition:
- 21 parts by weight of sodium salicylate,
- 8 parts by weight of sodium tetrapolyphosphate,
- 4 parts by weight of trisodium phosphate×12 water,
- 1 part by weight of benzyl alcohol and
- 66 parts by weight of demineralized water and having a pH of 7.6, by wiping over with a plush pad. After only a few seconds, the aluminum is laid bare in the unexposed areas.

The printing plate is developed scrum-free, exhibits a steep gradation and a high resolution, and yields a print run of 180,000 copies on a sheet-fed offset machine, without showing any significant abrasion of the printing stencil.

EXAMPLE OF APPLICATION 4

56 parts by weight of the polyvinyl butyral described in Example of Application 1 and 14 parts by weight of the unsaturated anhydride described in Example of Preparation 4 are dissolved in 980 parts by weight of methyl ethyl ketone and, after adding 1 part by weight of triethylamne, refluxed for five hours. After precipitation in water a white, fibrous polymer is obtained, which has an acid number of 24 and a carbon content of 61.8%, a hydrogen content of 9.2% and a nitrigen content of 0.65%. The yields amounts to 55 parts by weight. A coating solution prepared from 62 parts by weight of the above polymer,
21 parts by weight of the diazonium salt polycondensation product described in Example of Application 1,
2 parts by weight of phosphoric acid (85% strength),
3 parts by weight of Victoria Pure Blue FGA and
1 part by weight of phenylazodiphenylamine in
2,570 parts by weight of ethylene glycol monomethyl ether and
780 parts by weight of tetrahydrofuran is applied to an aluminum foil, as described in Example of Application 2 and is then treated with a developer of the following composition:

5.0 parts by weight of sodium octyl sulfate,
1.5 parts by weight of sodium metasilicate×5 water,
1.0 part by weight of trisodium phosphate×12 water
1.5 parts by weight of phenoxy ethanol,
91.0 parts by weight of demineralized water.

After wiping over with a plush pad for a few seconds only, the non-image areas are detached. The plate is then rinsed with water and dried.

A printing stencil of very high quality is obtained, in which even the finest elements of the original are exactly reproduced. Upon printing, ink trapping is remarkably quick. 280,000 impeccable prints are produced on a sheet-fed offset machine.

EXAMPLES OF APPLICATION 5 TO 9

Based on the following examples, the abrasion resistances of various photosensitive compositions are compared with each other, the compositions differing in the binder components used.

Example 5: Resin A comprises a reaction product of the polyvinyl butyral described in Example of Application 1 with the anhydride of Example of Preparation 1 and has an acid number of 45.

Comparison Example 6: Resin B comprises a reaction product of the polyvinyl butyral described in Example of Application 1 with 3-oxaglutaric anhydride and has an acid number of 50 (corresponds to Example 19 of German Offenlegungsschrift No. 34 04 366).

Comparison Example 7: Mixture of Resin B and Resin C. Resin C comprises a reaction product of equal molar quantities of 2,4-toluene diisocyanate and triethylene glycol.

Comparison Example 8: Resin D comprises a polymerization product of hydroxyethyl methacrylate, acrylonitrile and methyl methacrylate, which has subsequently been esterified with phthalic anhydride. The acid number is 32 (corresponds to Example 8 of U.S. Pat. No. 4,123,276).

Comparison Example 9: Mixture of Resin C and Resin D

Coating solutions are prepared, which have the following compositions in parts by weight:

|  | Example | | | | |
|---|---|---|---|---|---|
|  | 5 | 6(C) | 7(C) | 8(C) | 9(C) |
| Binder | 27 A | 27 B | 20 B 7 C | 27 D | 20 D 7 C |
| Diazo[1] | 16.5 | 16.5 | 16.5 | 16.5 | 16.5 |
| Dye[2] | 1.7 | 1.7 | 1.7 | 1.7 | 1.7 |
| Dye which changes color upon exposure[3] | 0.4 | 0.4 | 0.4 | 0.4 | 0.4 |
| Stabilizer[4] | 1.5 | 1.5 | 1.5 | 1.5 | 1.5 |
| Solvent[5] | 1370 | 1370 | 1370 | 1370 | 1370 |

[1]Polycondensation product as in Example of Application 1
[2]Victoria Pure Blue FGA (C.I. Basic Blue 81),
[3]phenylazodiphenylamine,
[4]phosphoric acid (85% strength),
[5]solvent mixture of 60.5% of ethylene glycol monomethyl ether, 27.5% of tetrahydrofuran and 12% of butyl acetate (85% purity).
(C)Comparison Example The solutions are filtered and coated upon aluminum supports which have been electrolytically grained in nitric acid, anodicially oxidized and post-treated with polyvinyl phosphonic acid, to give a dry layer weight of 1.0 g/m² in each case.

The photosensitive layers are exposed imagewise and treated with the developer specified in Example 4. All layers can be swiftly developed. The layers of Examples 5 and 6 have a steep gradation, whereas gradation of the layer of Example 8 is flatter and the layers of Examples 7 and 9 show an extremely flat gradation and thus make it difficult to determine the solid step of the test wedge. After a thorough examination it is, however, found that all layers have a solid step 4 in the continuous-tone step wedge.

The lithographic printing plates obtained are mounted side by side of a sheet-fed offset machine. Ink is rapidly accepted by all five plates. However, after a prolonged downtime ink receptivity of plates 7 and 9 is delayed.

In plates 6 and 8 first signs of breaking out in the screened areas are observed after printing about 150,000 copies; plates 7 and 9 reach print runs of up to about 190,000 copies, before the above-indicated phenomena are detected. The layer of Example 5 according to the present invention is still intact, even after a print run of 230,000 copies.

EXAMPLE OF APPLICATION 10

A terpolymer comprising 50% of hydroxyethyl methacrylate, 20% of methyl methacrylate and 30% of hexyl methacrylate and having an average molecular weight of about 35,000 is reacted with the anhydride of Example of Preparation 6, as described in Example of Application 1. The product has an acid number of 64.
A coating solution is prepared from
  3.5 parts by weight of the above-described reaction product,
  2.3 parts by weight of a diazonium salt condensation product prepared by condensing 1 mole of 3-methoxydiphenylamine-4-diazonium sulfate with 1 mole of 4-methyl-4'-methoxymethyl-diphenylether and then with 1 mole of 4,4'-bis-methoxymethyldiphenylether in an 85% strength phosphoric acid and precipitated as the mesitylene sulfonate,
  0.2 part by weight of phosphoric acid (85% strength), 0.1 part by weight of Crystal Violet (C.I. 42 555), and
0.1 part by weight of phenylazodiphenylamine in
160 parts by weight of ethylene glycol monomethyl ether.

After processing is described in Example of Application 2 a printing plate is obtained which produces many thousands of good prints.

EXAMPLES OF APPLICATION 11 TO 15

The layers described in Examples of Application 5 to 9 are tested for storage stability. For this purpose, a set of five plates is prepared from each phototsensitive composition and four plates, in each case, are heated at 100° C. in a drying oven for durations from 1 to 4 hours. For comparision, the fifth plate of each set is not subjected to storage at elevated temperature. After storage at elevated temperature the plates are exposed imagewise and developed with the developer specified in Example of Application 4. To show any remaining layer residues in the non-image areas the dried plates are inked with a protective ink.

All plates containing a single resin component (Examples of Application 5, 6 and 8) can be developed perfectly after two hours storage at elevated temperature. The layer of Example of Application 8 shows a marked extension of the continuous-tone step wedge. In the layers containing resin mixtures (Examples of Application 7 and 9), pronounced scumming is visible after heat treating for two hours.

After storing at elevated temperature for three hours, the layer of Example of Application 8 also shows first signs of scumming in the non-image areas, while the layers of Examples of Application 5 and 6 merely exhibit a slight extension of the continuous-tone step wedge.

The plates stored for four hours behave as follows: In the lithographic printing plate of Example of Application 11 according to the present invention (layer composition according to Example of Application 5) development is delayed and flake formation occurs; the continuous-tone step wedge is extended by four steps. The plate of Example of Application 12, which serves as a comparison plate (layer composition according to Example of Application 6) behaves similarly. The comparison plate of Example of Application 14 (layer composition according to Example of Application 8) shows severe scumming and is thus no longer unsable; the comparison plates of Examples of Application 13 and 15 (layer compositions according to Examples of Application 7 and 9) can no longer be developed. In the combination of storage stability and abrasion resistance the composition of the present invention is thus clearly superior to the compositions used for comparison.

EXAMPLE OF APPLICATION 16

According to Example of Application 1, 15 parts by weight of a terpolymer comprising 91% of vinyl chloride, 3% of vinyl acetate and 5% of vinyl alcohol and having an average molecular weight of 15,000 and a softening point of 75° C. are reacted with 8 parts by weight of the reaction product described in Example of Preparation 7, in dioxane as the solvent. The acid number of the product is 53.

A coating solution is prepared from
44.9 parts by weight of an 8.1% strength solution of the above-described polymeric reaction product in dioxane,
1.8 parts by weight of the diazonium salt polycondensation product as specified in Example of Application 1,
0.2 parts by weight of phosphoric acid (85% strength),
0.1 part by weight of Victoria Pure Blue FGA, and
0.06 part by weight of phenylazodiphenylamine in
150.0 parts by weight of ethylene glycol monomethyl ether.

The solution is applied to an aluminum foil which has been electrochemically grained, anodically oxidized and post-treated with polyvinyl phosphonic acid and is dried to give a dry layer weight of 0.73 g/m$^2$.

Processing is performed similarly to Example of Application 3. The plate is swiftly developed and there is no residual staining in the non-image areas.

When used on a sheet-fed offset machine, this printing plate yields a large print run.

EXAMPLE OF APPLICATION 17

The coating solution specified in Example of Application 1 is applied by spin coating to the support described in Example of Application 2. After drying, a layer weight of about 1 g/m$^2$ is obtained. Four plates of this type are stored in a cabinet, in which tropical conditions are simulated and which is heated at 40° C. and shows a relative humidity of 60%. One plate each is removed from the cabinet after 3, 6, 9 and 12 months, is exposed imagewise and developed as described in Example of Application 1. A plate which has not been subjected to these conditions and shows a solid step 4 in the continuous-tone step wedge when exposed for 25 seconds is used as a comparison plate.

The plates stored for three and six months correspond entirely to the original plate. They can be developed as quickly and free from staining as the original plate. The plate stored for nine months shows an extension of the continuous-tone step wedge by less than one step; it is developed as swiftly as the comparison sample. In the plate stored for one year the step wedge is extended by 1 to 1.5 steps; developability of the plate is hardly delayed. All plates are used for printing on a printing machine and do not show any differences in ink receptivity or their tendency towards scumming, compared with the comparison plate.

EXAMPLES OF APPLICATION 18 TO 21

In the following Examples of Application 18 to 21 different polymers containing hydroxyl groups are used, which are reacted according to Example of Application 1 with a constant quantity of the ester anhydride of trimellitic acid described in Example of Preparation 5. The reaction products obtained are employed in coating solutions corresponding to the coating solution of Example of Application 1.

EXAMPLE OF APPLICATION 18

20 parts by weight of the polyvinyl butyral specified in Example of Application 1 are reacted with 16 parts by weight of the anhydride described in Example of Preparation 5 in 350 parts by weight of methyl ethyl ketone, in the presence of 2.4 parts by weight of triethylamine. The solution obtained is added dropwise to water and the polymer which has been deposited is post-washed and dried. The polymer has an acid number of 62 and the following composition: 60.4% of C, 8.2% of H and 1.3% of N.

EXAMPLE OF APPLICATION 19

20 parts by weight of a polyvinyl butyral having a molecular weight of about 80,000 and containing 79% of vinyl butyral units, 2% of vinyl acetate units and 21% of vinyl alcohol units are reacted with 16 parts by weight of the anhydride described in Example of Preparation 5 in 350 parts by weight of methyl ethyl ketone, in the presence of 2.4 parts by weight of triethylamine. The solution obtained is further treated as described in Example of Application 18. The dried polymer has an acid number of 57 and the following composition: 61.3% of C, 8.0% of H and 1.4% of N.

EXAMPLE OF APPLICATION 20

20 parts by weight of a polyvinyl butyral having a molecular weight of about 70,000 to 80,000 and containing 86% of vinyl butyral units, 2% of vinyl acetate units and 12% of vinyl alcohol units are reacted, as described in Example of Application 19, with 16 parts by weight of the anhydride described in Example of Preparation 5. The precipitated polymer has an acid number of 51.

EXAMPLE OF APPLICATION 21

As described in Example of Application 18 a polyvinyl butyral is used, which has an average molecular weight of 20,000 to 30,000 and contains 71% of viyl butyral units, 2% of vinyl acetate units and 27% of vinyl alcohol units. The precipitated product has an acid number of 65.

EXAMPLES OF APPLICATION 22 AND 23

A coating solution having the following composition:
385 parts by weight of an 8% strength solution of the polymer specified in Example of Application 1 in methyl ethyl ketone,
12 parts by weight of the diazonium salt polycondensation product described in Example of Application 1,
2 parts by weight of phosphoric acid (85% strength),
1 part by weight of Crystal Violet (C.I. 42 555) and
0.4 part by weight of phenylazodiphenylamine in 1,350 parts by weight of ethylene glycol monomethyl ether is coated upon an aluminum support which has been electrolytically grained in hydrochloric acid, anodically oxidized and post-treated with polyvinyl phosphonic acid to give a dry layer weight of 0.95 g/m$^2$ (Example 22).

For comparison, a mixture of a corresponding composition is coated upon the above-described support. The mixture differs from the coating solution above in that the polymer used comprises
385 parts by weight of an 8% strength solution of the reaction product obtained by reacting the polyvinyl butyral described in Example of Application 1 with maleic anhydride, in methyl ethyl ketone (acid number of the precipitated polymer: 38), corresponding to German Offenlegungsschrift No. 34 04 366.

This mixture yields a dry layer weight of 0.95 g/m$^2$ (Comparison Example 23).

The two plates are exposed and treated with the developer described in Example of Application 1.

When the recording material according to the present invention is mounted on a sheet-fed offset machine 325,000 printed copies can be produced, while the recording material of the comparison example shows clear signs of wear after printing only 240,000 copies.

EXAMPLE OF APPLICATION 24

Aluminum plates which have been coated according to Example of Application 22 and are in the unexposed state are stored in a hot box at a temperature of 56° C. for 2, 6, 13 and 26 weeks. The plates which are removed from the hot box after the respective storage periods are exposed and developed as described in Example of Application 1. It is found that the plates stored at elevated temperature show hardly any delay in developing speed, even afer 26 weeks. The exposed and developed plates correspond to the standard of Example 22, even the finest lines and image elements of the original being perfectly resolved.

The recording material of the present invention has thus a very low sensitivity to heat, so that elevated temperatures which may sometimes occur when the material is improperly stored, do not give rise to any damage to the material.

EXAMPLE OF APPLICATION 25

The printing plate described in Example of Application 22 is mounted in a printing machine using UV-hardenable printing inks with high solvent contents.

The printing plate shows an excellent ink receptivity, and up to a print run of 200,000 copies impeccable reproductions of the original are obtained.

EXAMPLE OF APPLICATION 26

A coating solution is prepared, which corresponds to the coating solution of Example of Application 4. To this solution 2.5 parts by weight of a 45% strength, 2,5-dimethylhexane-2,5-di-t.-butyl-peroxide are added as a granular material with chalk. The mixture is coated on the support described in Example of Application 2 to give a dry layer weight of 1.05 g/m$^2$.

The imagewise exposed and developed printing plate is treated with a 3% aqueous solution of a polystyrene sulfonic acid and then heated for 5 minutes in a heating oven at 200° C.

After washing away the finisher composition, the lithographic printing plate is mounted in a sheet-fed offset machine. For comparison, a lithographic printing plate of the same composition and layer thickness, which has been treated in the same manner, but has not yet been burnt-in, is used for printing alongside of the burnt-in plate. The plate without burning-in treatment shows the first irregularities in its halftone screen after printing about 220,000 copies and its quality is impaired after printing about 260,000 copies, while the burnt-in plate does not exhibit any perceivable signs of wear when the test is stopped at 325,000 prints.

EXAMPLE OF APPLICATION 27

The mixture of Example of Application 22 is modified in such a way that it is admixed with 0.3 part by weight of a silicate predispersed in a polyvinyl butyral (Syloid ® AL1, manufactured by W. R. Grace & Co., in Mowital ® B20T, manufactured by Hoechst AG).

The layer thus obtained has a rough surface and can be evacuated at a markedly higher rate in the printing frame. The print run performance corresponds to that of Example of Application 22.

EXAMPLES OF APPLICATION 28 AND 29

A coating solution of the composition specified below is coated on an aluminum plate which has been electrolytically grained in nitric acid, anodically oxidized and post-treated with polyvinyl phosphonic acid to give a dry layer weight of 1.0 g/m² (Example 28):

22 parts by weight of a reaction product having an acid number of 52, which comprises a polyvinyl butyral having 78% of vinyl butyral units, 2% of vinyl acetate units and 20% of vinyl alcohol units and an average molecular weight of 25,000 to 35,000 and an ester of trimellitic anhydride, prepared from 4-chloroformyl-phthalic anhydride and 2-methylcarbamoyloxyethanol, 22 parts by weight of the diazonium salt polycondensation product specified in Example of Application 10, 1.9 parts by weight of phosphoric acid (85% strength), 2.6 parts by weight of Renol Carmine FBB-HW (C.I. Pigment Red 146) and 0.9 part by weight of phenylazodiphenylamine in 1,500 parts by weight of ethylene glycol monomethyl ether.

For comparision, a support of the same kind is coated in the same layer thickness with a coating solution having the following composition (Comparison Example 29):

22 parts by weight of a reaction product having an acid number of 55, which comprises the above-described polyvinyl butyral and an ester of trimellitic anydride, prepared from 4-chloroformylphthalic anhydride and 2-hydroxyethyl acetate, 22 parts by weight of the above-described diazonium salt polycondensation product, 1.9 parts by weight of phosphoric acid (85% strength), 2.6 parts by weight of Renol Carmine FBB-HW (C.I. Pigment Red 146), 0.9 part by weight of phenylazodiphenylamine in 1,500 parts by weight of ethylene glycol monomethyl ether.

The plates which have a strong red color are exposed imagewise for 20 seconds under a test original and are then developed with a developer of the following composition, by wiping over with a plush pad:

0.1 part by weight of sodium metasilicate×9 water, 3.9 parts by weight of disodium hydrogen phosphate×12 water, 3.4 parts by weight of trisodium phosphate×12 water, 1.5 parts by weight of potassium tetraborate×4 water, 2.0 parts by weight of potassium oxalate×1 water, 2.5 parts by weight of sodium benzoate and 2.0 parts by weight of sodium octylsulfate in 84.6 parts by weight of demineralized water.

The two plates can be developed rapidly and without staining, even the finest elements of the test original being reproduced.

When used for printing on a sheet-fed offset machine, the lithographic printing plate of the present invention produces 265,000 impeccable prints, while the comparision plate already shows signs of wear after printing 210,000 copies.

What is claimed is:

1. A photosensitive composition comprising (i) a photosensitive diazonium salt polycondensation product in an amount sufficient to render said composition photosensitive and (ii) a non-photosensitive polymeric binder with carboxyl side groups which is soluble or swellable in aqueous-alkaline solutions and which is present in an amount sufficient to impart layer-forming capability to a coating solution of said composition, said polymeric binder comprising the reaction product of a monofunctional intramolecular anhydride of an organic polycarboxylic acid with a polymer containing hydroxyl groups as the only functional groups capable of reaction with acid anhydrides, wherein the acid anhydride is a compound of the general formula (I)

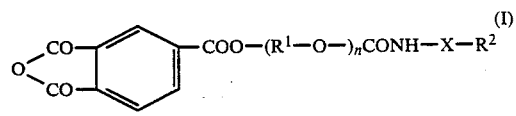

wherein
R¹ is an alkylene group having from 2 to 6 carbon atoms,
R² is a hydrogen atom, a substituted or unsubstituted alkyl, cycloalkyl, aryl or heteroyl group,
X is a single bond or one of the groups $CH_2$, $SO_2$ and $O=P-R^3$,
R³ is an alkyl, alkenyl or aryl group, and
n is a number from 1 to 6.

2. A photosensitive composition as claimed in claim 1, wherein the anhydride is a compound of the general formula I, in which n denotes a number from 1 to 3.

3. A photosensitive composition as claimed in claim 1, wherein the polymer containing hydroxyl groups has a hydroxyl number of at least 30.

4. A photosensitive composition as claimed in claim 1, wherein the polymer containing hydroxyl groups is selected from the group consisting of a polyvinyl acetal, a polyvinyl acetate having free hydroxyl groups, a copolymer of a hydroxyalkyl acrylate, and a copolymer of a hydroxyalkyl methacrylate.

5. A photosensitive composition as claimed in claim 1, wherein the binder has an acid number from 10 to 120.

6. A photosensitive composition as claimed in claim 1, wherein the negative-working diazonium salt polycondensation product comprises recurrent units A-N₂Q and B which are linked by intermediate members derived from condensible carbonyl compounds, wherein A comprises the radical of an aromatic diazonium compound which is capable of condensation with formaldehyde and B comprises the radical of a compound which is free of diazonium groups and is capable of condensation with formaldehyde.

7. A photosensitive composition according to claim 6, wherein B is the radical of a compound selected from the group consisting of an aromatic amine, a phenol, a phenol ether, aromatic heterocyclic compound and an organic acid amide.

8. A photosensitive composition as claimed in claim 6, wherein the units A-N₂Q are derived from compounds corresponding to the general formula (R⁶—R⁷—)$_p$R⁸—N₂Q wherein
Q is the anion of the diazonium compound, p is an integer from 1 to 3, $R^6$ is an aromatic radical which is capable of condensation with an active carbonyl compound, in at least one position, $R^8$ is an unsubstituted or substituted phenylene group, and $R^7$ is a single bond or one of the groups:
- $-(CH_2)_q-NR^9-$
- $-O-(CH_2)_r-NR^9-$,
- $-S-(CH_2)_r-NR^9-$,
- $-S-CH_2CO-NR^9-$,
- $-O-R^{10}-O-$,
- $-O-$,
- $-S-$, or
- $-CO-NR^9-$, wherein q ia a number from 0 to 5, r is a number from 2 to 5, $R^9$ is a hydrogen atom, an alkyl group having from 1 to 5 carbon atoms, an aralkyl group having from 7 to 12 carbon atoms or an aryl group having from 6 to 12 carbon atoms, and $R^{10}$ is an arylene group having from 6 to 12 carbon atoms, and wherein B is the radical of an aromatic amine, phenol, thiophenol, phenolether, aromatic thioether, aromatic hydrocarbon, an aromatic heterocyclic compound, or an organic acid amide, which is free of diazonium groups.

9. Photosensitive recording material comprising a support and a photosensitive layer, wherein the photosensitive layer comprises a composition as claimed in claim 1.

10. A photosensitive recording material as claimed in claim 9, wherein the support comprises aluminum or an aluminum alloy.

11. A photosensitive composition according to claim 6, wherein the intermediate members are methylene groups.

12. A photosensitive composition according to claim 2, wherein X is selected from the group consisting of a single bond and $SO_2$.

13. A photosensitive composition as claimed in claim 1, wherein said composition comprises from about 5 to 90% by weight of said diazonium salt polycondensation product and from about 30 to 90% by weight of said polymeric binder.

* * * * *